(12) United States Patent
Ha et al.

(10) Patent No.: US 7,955,760 B2
(45) Date of Patent: Jun. 7, 2011

(54) METHOD OF CORRECTING DEFECT IN PHOTOMASK

(75) Inventors: Tae Joong Ha, Cheongju-si (KR); Hee Chun Kim, Cheongwon-gun (KR)

(73) Assignee: Hynix Semiconductor Inc., Icheon-si (KR)

( * ) Notice: Subject to any disclaimer, the term of this patent is extended or adjusted under 35 U.S.C. 154(b) by 355 days.

(21) Appl. No.: 12/163,213

(22) Filed: Jun. 27, 2008

(65) Prior Publication Data

US 2009/0098470 A1    Apr. 16, 2009

(30) Foreign Application Priority Data

Oct. 15, 2007   (KR) .................. 10-2007-0103486

(51) Int. Cl.
*G03F 1/00* (2006.01)
*G03C 5/00* (2006.01)
(52) U.S. Cl. ............... 430/5; 430/311; 430/394
(58) Field of Classification Search .......... 430/5, 311, 430/394; 257/499; 438/513
See application file for complete search history.

(56) References Cited

U.S. PATENT DOCUMENTS

| 5,981,110 A | 11/1999 | George et al. | |
| 6,740,456 B2 | 5/2004 | Kanamitsu et al. | |
| 6,806,007 B1 * | 10/2004 | Abdo et al. | 430/5 |
| 2003/0146485 A1 * | 8/2003 | Ezaki | 257/499 |
| 2004/0137337 A1 * | 7/2004 | Chen | 430/5 |
| 2004/0209172 A1 * | 10/2004 | Takaoka et al. | 430/5 |
| 2005/0255386 A1 * | 11/2005 | Kim et al. | 430/5 |
| 2006/0093925 A1 * | 5/2006 | Cheng | 430/5 |
| 2006/0166107 A1 * | 7/2006 | Chen et al. | 430/5 |
| 2007/0026321 A1 * | 2/2007 | Kumar | 430/5 |
| 2007/0032054 A1 * | 2/2007 | Ramaswamy et al. | 438/513 |

FOREIGN PATENT DOCUMENTS

| JP | 2007-256491 | 10/2007 |
| KR | 10-2007-0068898 | 7/2007 |

* cited by examiner

*Primary Examiner* — Stephen Rosasco
*Assistant Examiner* — Rashid Alam
(74) *Attorney, Agent, or Firm* — Marshall, Gerstein & Borun LLP

(57) ABSTRACT

Disclosed herein is a method of correcting defects in photomasks. According to one embodiment, a light absorption layer is formed on a photomask where pin hole defects occur in a light blocking layer, and light absorption patterns are formed on the pin hole defect portions by selectively etching the light absorption layer. According to another embodiment, a light absorption layer is formed on a backside of a photomask having pin hole defects in a light blocking layer, and light absorption patterns are formed on the backside of the photomask substrate corresponding to a region having pin hole defects by etching the light absorption layer.

10 Claims, 5 Drawing Sheets

METHOD OF CORRECTING DEFECT IN PHOTOMASK

CROSS-REFERENCE TO RELATED APPLICATION

Priority to Korean patent application number 10-2007-0103486, filed on Oct. 15, 2007, the disclosure of which is incorporated by reference in its entirety, is claimed.

BACKGROUND OF THE INVENTION

1. Field of the Disclosure

The present invention relates to a method of fabricating a semiconductor device, and more particularly, to methods of correcting defects in photomasks.

2. Brief Description of Related Technology

A photomask is used to form a pattern on a wafer during a process of fabricating a semiconductor device. The photomask is used to transfer a pattern of a mask on a wafer through a photolithography process. Accordingly, processes of fabricating a photomask are regarded as very important operations. To fabricate a binary mask, a light blocking layer and a resist layer are formed on a transparent substrate. A light exposure process and a development process are performed to form a resist pattern that selectively exposes the resist on the light blocking layer. Using the resist pattern as an etching mask, the exposed light blocking layer is etched to form a light blocking pattern, and then the remaining resist pattern is removed.

While a photomask is formed, pin hole defects can occur due to equipment malfunctions. A pin hole defect results from a portion of the light blocking layer not forming where it is supposed to form. This pin hole defect may allow transmission of light during a wafer exposure process, thereby causing defective patterns. If the pin hole defect occurs, a method through a focused ion beam (FIB) can be used to correct the pin hole defect. Because the FIB corrects the pin hole defect locally, additional defects or damage may occur due to correction equipment. Additionally, if the size of the pin hole defect is more than several hundred micrometers (μm), there are limitations in correcting it locally.

SUMMARY OF THE INVENTION

Embodiments of the present invention are directed to a method of correcting defect in a photomask.

In one embodiment, a method of correcting defects of a photomask includes: forming a light absorption layer on a photomask having a pin hole defect in a light blocking layer; and forming a light absorption pattern on the pin hole defect by selectively etching the light absorption layer.

The light absorption layer may include a carbon layer. Forming the light absorption pattern may include: forming a negative resist layer on the light absorption layer; selectively exposing the negative resist layer; developing the resist layer to form a resist pattern to block the pin hole defect in the light blocking pattern; etching the light absorption layer using the resist pattern as an etching mask; and removing the resist patterns.

In another embodiment, a method of correcting defects of a photomask includes: forming a light absorption layer on a backside of a photomask having a pin hole defect in a light blocking layer; and forming a light absorption pattern on the backside of the photomask substrate corresponding to a region with the pin hole defect by etching the light absorption layer.

Forming the light absorption pattern on the backside of the photomask may include: forming a light absorption layer and a resist layer on the backside of the photomask; selectively exposing the photomask by projecting ultraviolet light on the resist layer; forming a resist pattern by developing the resist layer in a region backside of the photomask corresponding to the pin hole defect; forming a light absorption pattern by etching the absorption layer using the resist pattern as an etching mask; and removing the resist pattern.

Figure 1:
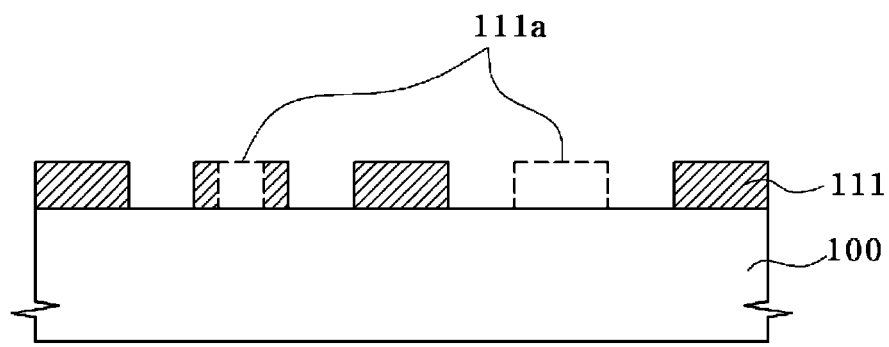
FIGS. 1 through 4 illustrate a method of correcting a defective photomask according to one embodiment of the present invention.

While the disclosed method is susceptible of embodiments in various forms, specific embodiments are illustrated in the drawings (and will hereafter be described), with the understanding that the disclosure is intended to be illustrative, and is not intended to limit the invention to the specific embodiments described and illustrated herein.

DESCRIPTION OF SPECIFIC EMBODIMENTS

Hereinafter, a method of correcting defect in a photomask will be described in detail with reference to the accompanying drawings.

Embodiment 1

Referring to FIG. 1, a photomask having a light blocking pattern 111 is fabricated on a transparent substrate 100. The photomask is a binary mask having the light blocking pattern 111 on the transparent substrate 100. If necessary, the photomask may be a phase shift mask where a phase shift pattern and light blocking pattern are disposed on the transparent substrate. For example, a light blocking layer and a resist layer are first formed on a transparent substrate, such as a quartz substrate, to form a binary mask. The light blocking layer may be formed of a material, e.g., chromium (Cr), that can block transmitted light. An exposure process using an electron beam is performed on the resist layer, and a development process using a developer is performed on the exposed resist layer. Then, a portion of the resist layer, where the electron beam is projected, is selectively removed to form a resist pattern. An etching process using the resist pattern as an etching mask is performed to form a light blocking pattern. Thereafter, the resist pattern is removed. At this point, the light blocking layer is formed of a material, e.g., Cr that can block a transmitted light. Alternatively, the photomask may be a phase shift mask where a phase shift pattern and light blocking pattern are disposed on the transparent substrate. A phase shift pattern includes a main region and a frame region. A light blocking pattern is selectively disposed on the phase shift pattern of a frame region.

However, because of abnormal etching processes or equipment malfunction during fabricating of a photomask, pin hole defects may occur in which a light blocking pattern 111 is not formed on a portion where the light blocking pattern 111 is supposed to be formed. Especially, because the light blocking pattern 111 is formed in a frame region of the phase shift mask, pin hole defects may occur therein. A pin hole defect 111*a*, indicated by a dotted rectangle, represents where the light blocking pattern 111 should have formed. The pin hole defect 111a may allow transmission of light during a wafer exposure process, thereby causing a defective wafer pattern.

Figure 2:
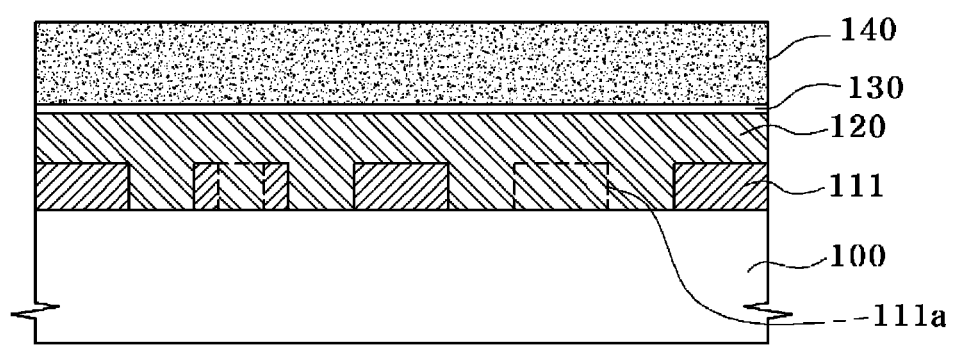

Referring to FIG. 2, a light absorption layer 120 and a resist layer 140 are formed on a photomask having the pin hole defect 111a. The light absorption layer 120 may include a carbon layer. The carbon layer may be formed through coating or deposition of a compound including carbon as a reaction source. When the hydrogen content in the carbon layer is decreased, the carbon layer has a higher light absorption rate. Accordingly, etch selectivity and optical characteristics can be controlled by adjusting the hydrogen and carbon content of the carbon layer. The resist layer 140 may include a negative resist layer. Before forming the resist layer 140, an oxide layer 130 may be formed on the light absorption layer 120. The oxide layer may be formed through an oxidation process using an oxygen source gas. For example, the oxide layer 130 is formed by supplying an oxygen gas inside a reaction chamber and applying an appropriate voltage. The oxide layer 130 can be formed with a relatively thinner thickness than the light absorption layer 120. For example, the light absorption layer 120 can have a higher etch selectivity than the oxide layer 130. Accordingly, even if the oxide layer 130 is formed with a thin thickness, the light absorption layer 120 having a relatively thicker thickness than the oxide layer 130 can be patterned.

Figure 3:
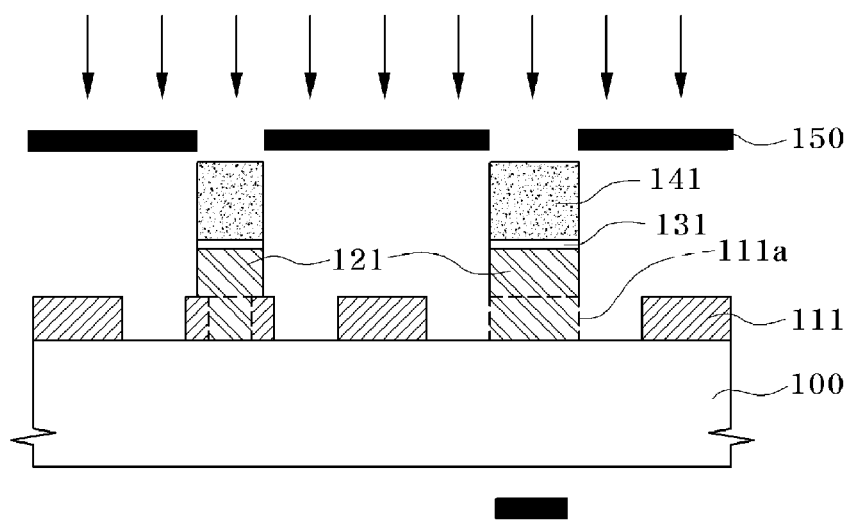

Referring to FIG. 3, an exposure process and a development process form resist patterns 141, which block the pin hole defect 111a of FIG. 1. If the resist layer 141 includes a negative resist layer, the portion where light is not projected during an exposure process is removed by a developer, and the portion where light is projected remains. The remaining portion becomes the resist pattern 141. The resist pattern 141 is used as an etching mask when patterning the light absorption layer 120 to correct the pin hole defect 111a. Specifically, after loading a photomask into exposure equipment, an exposure blocking layer 150 is disposed between an exposure light source and the photomask to expose all the portions where the pin hole defects 111a occur. After performing the expose process on all the portions having the pin hole defect 111a, the portions where the light is not projected are removed using a developer.

The exposed oxide layer 130 and the light absorption layer 120 are selectively etched with the resist patterns 141 to form an oxide pattern 131 and a light absorption pattern 121. The pin hole defects are corrected while the oxide pattern 131 and the light absorption pattern 121 are formed, and the portion without pin hole defects is removed through an etching process. The oxide pattern 131 is used as a hard mask when performing an etching process on the light absorption layer 120. The light absorption layer 120 may be etched with a dry etching process using oxygen plasma. The oxide pattern 131 and the light absorption pattern 121 become a light blocking area that blocks light together with the light blocking pattern 111 during a subsequent wafer exposure process. Accordingly, when there are a large number or size of the pin hole defects, the pin hole defects can be corrected by the light absorption pattern 121. Therefore, the process time for correcting pin hole defects can be reduced and device yield can be improved.

Figure 4:
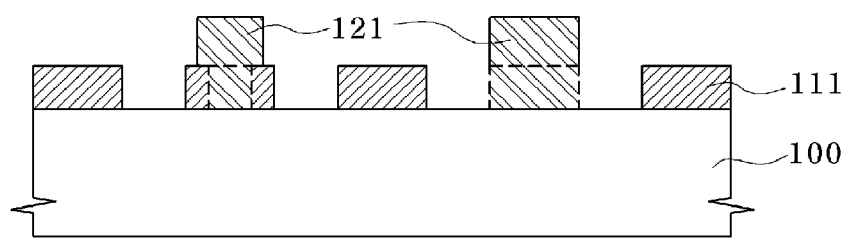

Referring to FIG. 4, the oxide pattern 131 and the resist pattern 141 are removed. The light absorption pattern 121 is formed on the portions with pin hole defects to correct the pin hole defects. The light absorption layer 120, e.g., a carbon layer, is used as material that absorbs light according to carbon contents, such that the light absorption layer 120 and the light blocking pattern 111 become a light blocking area during a subsequent wafer exposure process. Therefore, wafer patterning defects caused by pin hole defects can be prevented.

Embodiment 2

Figure 5:
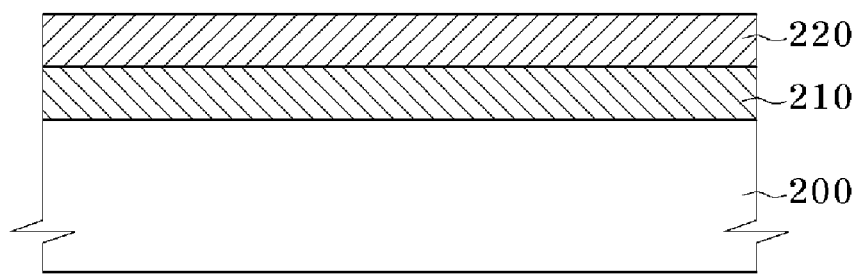
FIGS. 5 through 10 illustrate a method of correcting a defective photomask according to another embodiment of the present invention.

Referring to FIG. 5, a phase shift mask including a light blocking pattern 220 and a phase shift pattern 210 is formed. To form the phase shift mask, a phase shift layer, a light blocking layer, and a resist layer are formed first on a transparent substrate 200, such as a quartz substrate, and then a conventional exposure process using an electron beam is performed on the resist layer. A development process using a developer is performed on the exposed resist layer to form a resist pattern. The resist pattern is used as an etching mask in an etching process to form the light blocking pattern 220 and the phase shift pattern 210. Then, the resist layer is removed. The phase shift layer can include a material that can shift the phase of light, such as molybdenum silicon oxide nitride (MoSiON). The light blocking layer may include a material that can block the transmitted light, such as chromium (Cr).

Figure 6:
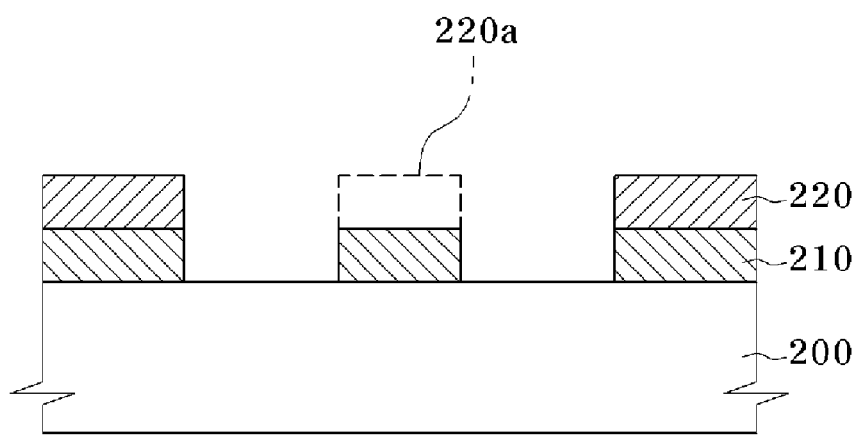

However, as illustrated in FIG. 6, during photomask fabrication, a pin hole defect 220a occurs due to an abnormal etching process or equipment malfunction. This pin hole defect 220a can occur mainly during a second exposure process for defining a blocking area in phase shift masks. The pin hole defect 220a may allow the transmission of light during a subsequent wafer exposure process, thereby causing a defective wafer pattern.

Figure 7:
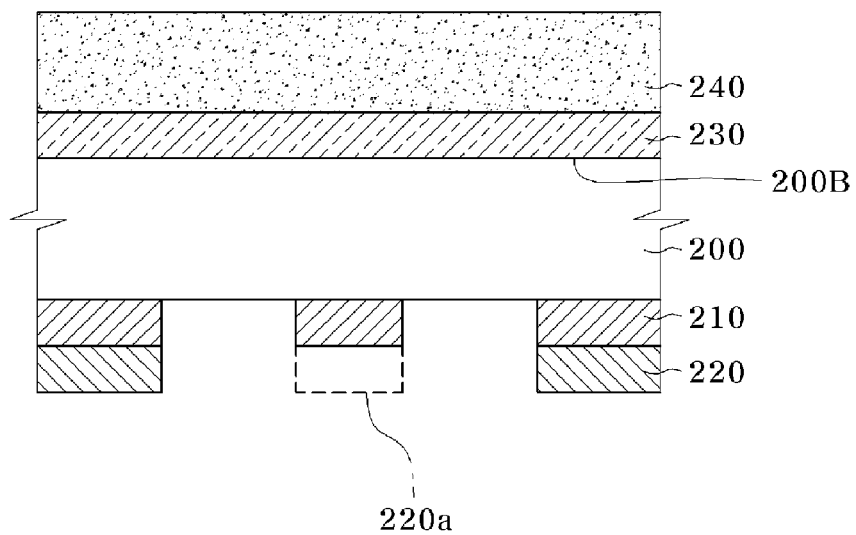

Referring to FIG. 7, a light absorption layer 230 and a resist layer 240 are formed on the backside of the mask substrate 200 having the pin hole defect 220a. The light absorption layer 240 may include a carbon layer. The carbon layer may be formed through coating or deposition using a compound including carbon as a reaction source. The carbon layer has a higher light absorption rate when the hydrogen content of the carbon layer is decreased. Accordingly, etch selectivity and optical characteristics can be controlled by adjusting the hydrogen and carbon content of the carbon layer. The resist layer 240 may include a negative resist layer where the exposed portion remains.

Figure 8:
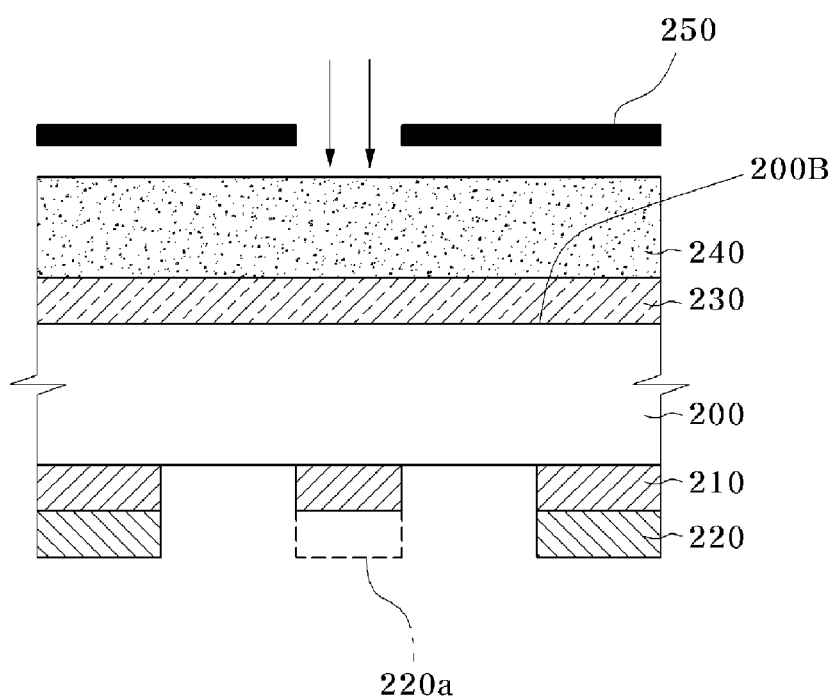

Referring to FIG. 8, an ultraviolet light is projected on the resist layer 240 to expose it. Using an aperture 250, ultraviolet light is only projected on the region corresponding to the pin hole defect 220a. However, a broader portion with the pin hole defect 220a may be exposed to the ultraviolet light by opening the aperture 250. Accordingly, because higher repair accuracy is not required, processes can easily be performed. When projecting ultraviolet light on the resist layer 240, the resist layer 240 can be simultaneously implanted with a small amount of gallium (Ga) ions.

Figure 9:
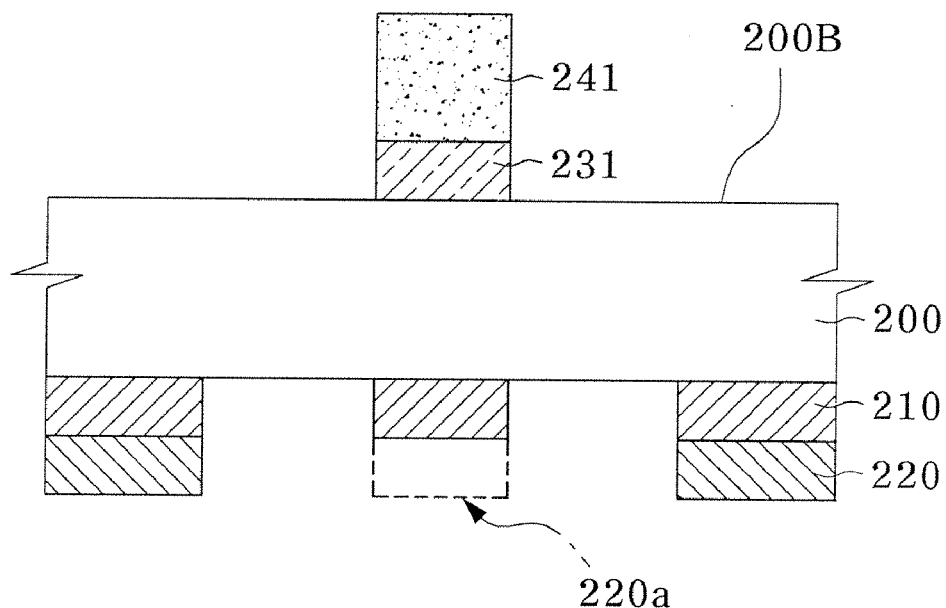

Referring to FIG. 9, the resist layer 240 is developed using a developer. Then, the resist layer 240 in a region where ultraviolet light is not projected is removed, and the resist layer 240 in the exposed region remains, thereby forming a resist pattern 241. By using the resist pattern 241 as an etching mask, the exposed light absorption layer 230 is etched to form a light absorption pattern 231 on the backside 200B of the photomask corresponding to the pin hole defect. The light absorption pattern 231 may be formed by selectively etching using an organic solvent on the light absorption layer.

Figure 10:
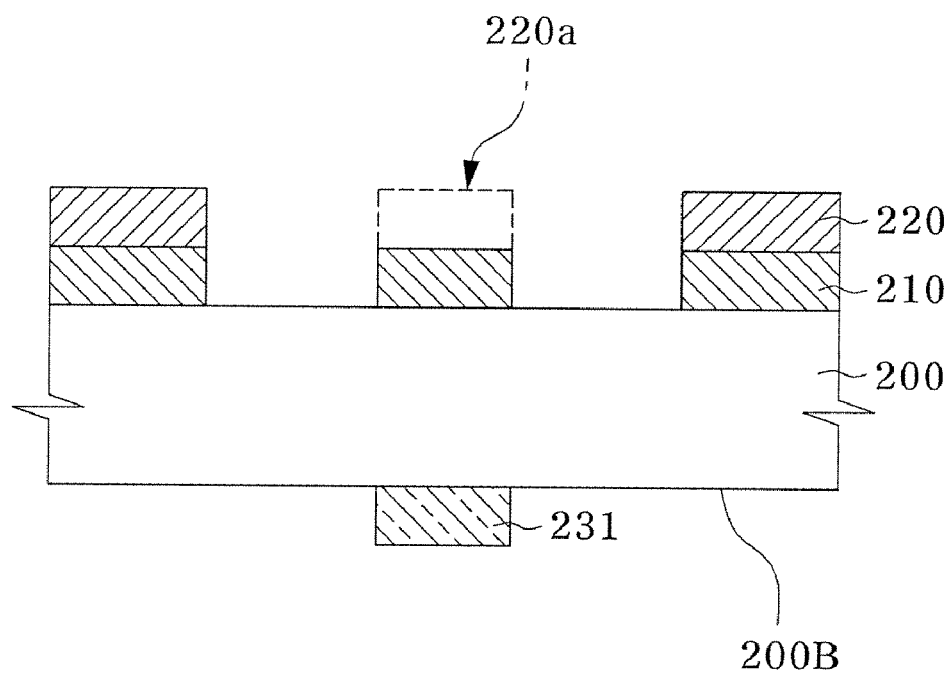

Referring to FIG. 10, the remaining resist pattern 241 on the light absorption pattern 231 is removed. Only the light absorption pattern 231 remains on the backside 200B of the photomask in a region having the pin hole defect. Since the resist pattern 241 is hardened by ultraviolet light projection and ion implantation, it is difficult to remove the resist pattern

241 by a conventional a developer, cleanser, or strip process. Accordingly, the hardened resist pattern 241 is removed by a dry etching process using oxygen plasma. Because the light absorption layer 230, e.g., a carbon layer, includes a material that absorbs light according to carbon content, it blocks light transmission at a portion where the pin hole defect occurs during a subsequent wafer exposure process.

While the present invention has been described with respect to specific embodiments, it will be apparent to those skilled in the art that various changes and modifications may be made without departing from the spirit and scope of the invention as recited in the following claims.

What is claimed is:

1. A method of correcting defects in a photomask, the method comprising:
    forming a light blocking pattern on a substrate of a photomask, the photomask having a pin hole defect wherein the light blocking pattern is not formed on a portion of the photomask where the light blocking pattern is supposed to be formed;
    forming a light absorption layer on the light blocking pattern and the substrate to cover the portion of the photomask where the pin hole defect occurs;
    forming a resist layer on the light absorption layer;
    exposing and developing the resist layer to form a resist pattern; and,
    selectively etching a portion of the light absorption layer exposed by the resist pattern to form a light absorption pattern, the light absorption pattern covering the portion of the photomask where the pin hole defect occurs.

2. The method of claim 1, wherein the light absorption layer comprises a carbon layer.

3. The method of claim 1, further comprising forming an oxide layer on the light absorption layer.

4. The method of claim 1, wherein forming the light absorption pattern comprises:
    forming a negative resist layer as the resist layer on the light absorption layer.

5. The method of claim 1, wherein selectively etching the portion of the light absorption layer comprises a dry etching process using oxygen plasma.

6. A method of correcting defects of a photomask comprising:
    forming light blocking patterns on a front side of a substrate of a photomask, the photomask having a pin hole defect wherein the light blocking pattern is not formed on a portion of the photomask where the light blocking pattern is supposed to be formed;
    forming a carbon layer on a back side of the substrate opposite the front side; and,
    selectively etching the carbon layer to form a light absorption pattern, the light absorption pattern covering a second portion of the back side that is opposite the first portion and the light absorption pattern covering the portion of the photomask where the pin hole defect occurs.

7. The method of claim 6, wherein selectively etching the carbon layer comprises:
    forming a resist layer on the carbon layer;
    exposing the resist layer by projecting ultraviolet light to harden the projected region of the resist layer;
    forming a resist pattern by developing the resist layer to form a resist pattern of the hardened region;
    etching the carbon layer using the resist pattern as an etching mask; and
    removing the resist pattern.

8. A method of correcting defects of a photomask comprising:
    forming light blocking patterns on a front side of a substrate of a photomask, the photomask having a first portion with a pin hole defect wherein the light blocking pattern is not formed on a portion of the photomask where the light blocking pattern is supposed to be formed;
    forming a carbon layer on a back side of the substrate opposite the front side;
    forming a resist layer on the carbon layer;
    exposing the resist layer by ion implantation of gallium (Ga) ions on the resist layer to harden the ion implanted region of the resist layer;
    forming a resist pattern of the hardened region by developing the resist layer;
    selectively etching the carbon layer using the resist pattern as an etching mask to form a light absorption pattern, the light absorption pattern covering a second portion of the back side that is opposite the first portion and the light absorption pattern covers the portion of the photomask where the pin hole defect occurs.

9. The method of claim 6, comprising etching the carbon layer by selectively etching the light absorption layer using an organic solvent on the light absorption layer.

10. The method of claim 6, wherein the pin hole defect exists in a frame region of the photomask.

* * * * *